(12) United States Patent
Immordino, Jr. et al.

(10) Patent No.: US 11,056,870 B2
(45) Date of Patent: Jul. 6, 2021

(54) MAGNETIC DECORATIVE TRIM WITH DC POWER TRANSMISSION

(71) Applicant: UNITED STATES GYPSUM COMPANY, Chicago, IL (US)

(72) Inventors: Salvatore C. Immordino, Jr., Trevor, WI (US); Terry Rosenstiel, Vernon Hills, IL (US); Mark Joseph, Chicago, IL (US); Suman Sinha Ray, Chicago, IL (US); William White, Grayslake, IL (US); Alexander Dadakis, Winnetka, IL (US)

(73) Assignee: UNITED STATES GYPSUM COMPANY, Chicago, IL (US)

( * ) Notice: Subject to any disclaimer, the term of this patent is extended or adjusted under 35 U.S.C. 154(b) by 38 days.

(21) Appl. No.: 16/391,014

(22) Filed: Apr. 22, 2019

(65) Prior Publication Data
US 2020/0099210 A1   Mar. 26, 2020

Related U.S. Application Data

(60) Provisional application No. 62/733,926, filed on Sep. 20, 2018.

(51) Int. Cl.
*H02G 3/30* (2006.01)
*F16B 1/00* (2006.01)
*H05K 7/02* (2006.01)

(52) U.S. Cl.
CPC ............. *H02G 3/30* (2013.01); *F16B 1/00* (2013.01); *H05K 7/02* (2013.01); *F16B 2001/0035* (2013.01); *H02G 3/305* (2013.01)

(58) Field of Classification Search
CPC ....................................................... H02G 3/30
See application file for complete search history.

(56) References Cited

U.S. PATENT DOCUMENTS

| 4,709,522 A | 1/1987 | Carnahan |
| 6,216,406 B1 | 4/2001 | Hauser |
| 6,504,098 B2 * | 1/2003 | Seamans ................. H02G 3/266 174/68.3 |

(Continued)

FOREIGN PATENT DOCUMENTS

CN    203813353 U    9/2014

OTHER PUBLICATIONS

International Search Report from corresponding International Patent Application No. PCT/US2019/051278, dated Sep. 16, 2019.

*Primary Examiner* — William H. Mayo, III
*Assistant Examiner* — Krystal Robinson
(74) *Attorney, Agent, or Firm* — Greer, Burns & Crain, Ltd.; Philip T. Petti; Pradip Sahu

(57) ABSTRACT

A decorative interior trim piece is provided for use in a low voltage power transmission system, and includes an outer, decorative surface, an opposite inner surface facing a substrate, a first end surface and an opposite second end surface. At least one conductive element extends from the first end surface to said second end surface on the inner surface. Each conductive element has a connector surface at each of the first end and second ends. At least one magnetic fastener is secured to the inner surface for releasably attaching the trim piece to the substrate. A complementary low voltage power transmission system is also disclosed.

10 Claims, 6 Drawing Sheets

(56) References Cited

U.S. PATENT DOCUMENTS

| | | | |
|---|---|---|---|
| 6,727,427 B1 * | 4/2004 | Gutman | H02G 3/0425 |
| | | | 174/492 |
| 7,114,826 B1 * | 10/2006 | Lilly | F21V 21/02 |
| | | | 362/146 |
| 8,029,881 B2 | 10/2011 | Surace et al. | |
| 8,314,336 B2 | 11/2012 | Liang et al. | |
| 8,624,750 B2 | 1/2014 | Azancot et al. | |
| 9,208,924 B2 | 12/2015 | Boss et al. | |
| 9,800,038 B2 | 10/2017 | Noh et al. | |
| 9,825,461 B2 | 11/2017 | Hodrinsky et al. | |
| 10,535,985 B2 * | 1/2020 | Jain | E04F 19/026 |
| 2009/0242538 A1 * | 10/2009 | Porzio | F24D 19/02 |
| | | | 219/213 |
| 2010/0170616 A1 | 7/2010 | Boss et al. | |
| 2013/0263538 A1 * | 10/2013 | Cosper | B29C 44/10 |
| | | | 52/287.1 |
| 2014/0091638 A1 | 4/2014 | Azancot et al. | |
| 2016/0003428 A1 * | 1/2016 | Anderson | F21S 4/26 |
| | | | 362/147 |
| 2016/0079023 A1 | 3/2016 | Boss et al. | |
| 2018/0123402 A1 | 5/2018 | Cheatham, III et al. | |
| 2019/0177983 A1 | 6/2019 | Klein | |

* cited by examiner

MAGNETIC DECORATIVE TRIM WITH DC POWER TRANSMISSION

RELATED APPLICATION

The present application claims 35 USC 119 priority from U.S. Patent Application Ser. No. 62/733,926 filed Sep. 20, 2018, the contents of which are incorporated by reference herein.

BACKGROUND

The present invention relates to interior wall construction, and more specifically to technology used for powering objects mounted to wallboard panels.

Wallboard panels, and more particularly, gypsum wallboard panels, are commonly utilized in building construction. These panels, including a core of gypsum coated with face and backing sheets of paper, are commonly used to construct walls, ceilings, partitions and in many other applications. It is well known in the art that wallboard panels are optionally made of other materials besides gypsum.

Wallboard panels provide many advantages in construction: they are light-weight, yet fire-resistant and easy to install. Due to the widespread use of gypsum wallboard panels as interior walls and ceilings, there is often a need to attach various objects to the panels, such as for example, framed photos or paintings, light fixtures, wireless speakers, flat TV screens or other electronic appliances. Conventionally, attaching an object to a wall or ceiling requires fasteners such as nails or screws, and related hooks or brackets. Further, installation of electronic appliances onto walls usually requires creating holes in the wall for accommodating power and/or media connection lines or by attachment of unsightly chases or tracking to run wires over the surface of the wall panel.

However, after the object is no longer needed and is removed from the wallboard panel, the panel's surface remains damaged, with a hole left in the place where the fasteners and any power or connection lines used to be. Restoring the damaged wallboard panel typically requires patching a hole with at least one coat of spackle or joint compound, sanding it and then painting over the patch to blend the repaired area with the rest of the panel. However, even after all these steps, the damaged panel may still continue to look uneven as it is difficult to match the color and texture of a finished wall.

A system for embedding magnetic grids in wallboard panels is disclosed in commonly-assigned U.S. Pat. No. 9,849,649, incorporated by reference. While the disclosure in that patent is useful, there is still a need for a more economical embodiment.

In addition, there is an increased demand in the use of low powered, specifically direct current (DC) powered appliances and smart devices that contain one or more components such as digital displays, light emitting diodes, sensors, speakers, microphones, small form factor computers, and the like. While many of these devices can be powered by standard 120-volt alternating current (AC) systems, they usually contain a transformer to reduce the overall voltage and current down to 3, 5 or 12-volt DC. It is inefficient and costly to install high voltage copper wire and conduit lines to carry alternate current throughout a built space when a growing number of these appliances and smart devices are powered by low voltage direct current. Additionally, the ever increasing numbers of smart devices result in the need to attach a multitude of wall electrical outlet plug adapters to increase the number of devices that can be attached to a given outlet resulting in a lower aesthetic due to power adapter clutter and fire risks due to power overloads. There is a need for a low voltage direct current distribution system that is inconspicuous, ubiquitous, accessible throughout built spaces.

SUMMARY

The above-listed needs are met or exceeded by the present system, employing common architectural trim pieces, including but not limited to baseboard, cornice, crown moulding, chair rail and the like as the support for transmitting power. In one embodiment, an engineered void space is created in the trim piece that accommodates electronic components such as sensors, inductive chargers, or radio frequency transmitters. Electrically conductive trim pieces are then connectable to each other to transmit power throughout the space. Further, trim pieces are used to conceal additional wires, cables or other components. The present powered trim pieces are attachable to the wall panel using magnetic fasteners. The magnetic fasteners feature the ability to readily exchange the items supported on the substrate without incurring wall damage. In addition, conductive ink, strips, or conductive paper tape used to reinforce the seams between panels are applicable to the wall surface for connecting electronic appliances mounted on the wall remote from the trim pieces, as well as, connecting the walls to other surfaces of the built space such as the ceiling or floor. Alternately, the trim pieces can be used to deliver power across the entire surface of the wall using a conductive paint, film, conductive metal foil, or conductive paper. In this fashion, a positive charge can be applied to the front of the wall panel while a negative or ground can be applied to the back of the panel allowing device access to power anywhere on the surface without the need to run conductive strips. Devices only need to contact the face of the panel and pierce the back with a small conductive element. The conductive material can be concealed using standard wall finishing methods such as being covered with wallboard joint compound and/or paint.

More specifically, a decorative interior trim piece is provided for use in a low voltage power transmission system, and includes an outer, decorative surface, an opposite inner surface facing a substrate, a first end surface and an opposite second end surface. At least one conductive element extends from the first end surface to said second end surface on the inner surface. Each conductive element has a connector surface at each of the first end and second ends. At least one magnetic fastener is secured to the inner surface for releasably attaching the trim piece to the substrate.

In an embodiment, the trim piece is one of a base board, crown molding and chair rail. In an embodiment, the low voltage system is configured for operating in the range of 3-48 volts, preferably as DC. In an embodiment, at least one recessed compartment is provided on the inner surface and is dimensioned for accommodating an IOT device, contemplated as one of an induction coil, wireless power transmitter, or smart sensor that can be concealed within the trim. In an embodiment, at least one substrate conductive element is constructed and arranged for connection between the trim piece and a corresponding powered device. In an embodiment, the at least one substrate conductive element is conductive tape, conductive strips such as copper foil strips, conductive paint, conductive nonwoven mesh, conductive paper, or conductive ink.

In another embodiment, a low power distribution system is provided for use on interior walls defining at least one vertical substrate, the system including a plurality of trim pieces associated with the substrate, each trim piece having an outer, decorative surface, an opposite inner surface facing the substrate, a first end surface and an opposite second end surface. At least one conductive element extends from the first end surface to the second end surface on the inner surface, each conductive element having a connector surface at each first end and second end, so that upon adjacent trim pieces contacting each other, the first end of one trim piece contacts second end of another trim piece. The conductive elements are in registry with each other for making electrical connection with each other. At least one magnetic fastener is secured to the inner surface of each trim piece for releasably attaching the trim piece to a complementary magnetic fastener secured to the substrate.

In an embodiment, at least one conductive element is provided on the inner surface of at least one trim piece, and is constructed and arranged for connection to at least one substrate conductive element connected to a corresponding powered device. The substrate conductive element is preferably conductive tape, conductive strips, or conductive ink.

DETAILED DESCRIPTION

Figure 1:
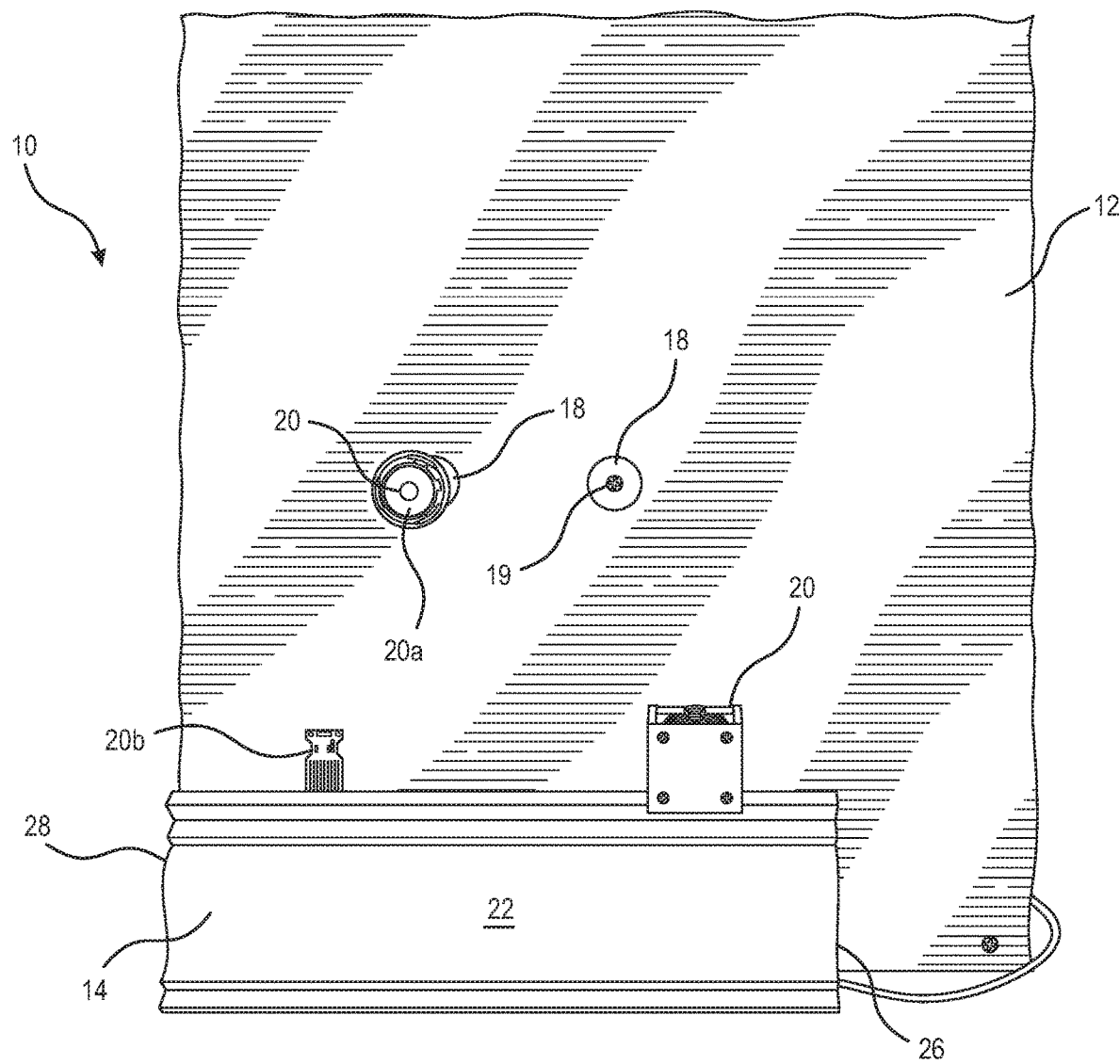
FIG. 1 is a fragmentary front view of a wall equipped with the present decorative trim and hidden wall connection system.
Figure 2:
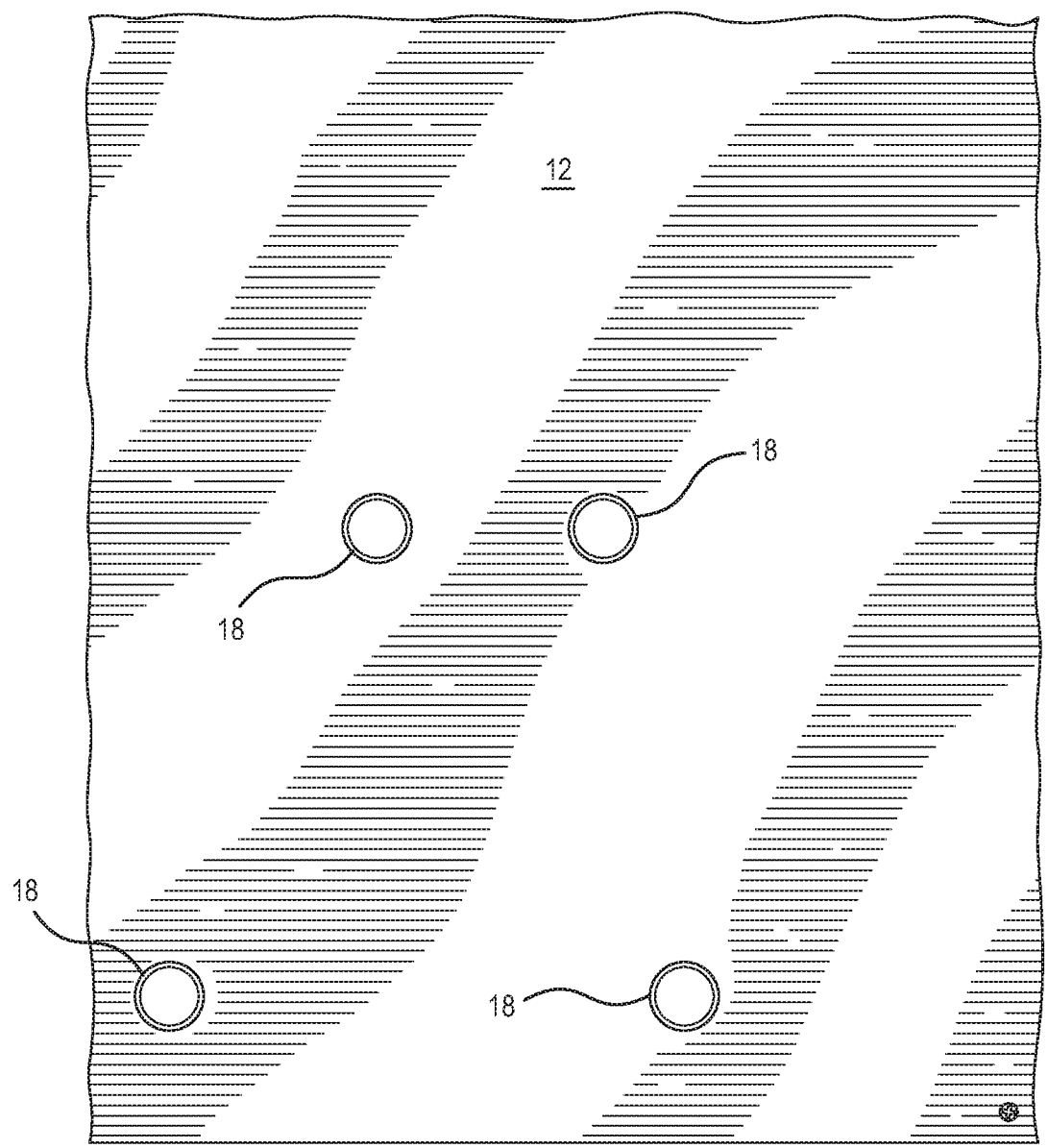
FIG. 2 is a fragmentary front view of a wall designed for use with the present system, and having a plurality of embedded magnetic fasteners.

Referring now to FIGS. 1-5, the present power distribution system is generally designated 10, and is designed for application on an existing substrate 12, preferably a wall surface, however, in addition to wall surfaces, ceiling and floor surfaces are also contemplated as substrates. The system 10 includes at least one and preferably a plurality of conductive trim pieces 14, here shown as baseboards, however, other types of trim pieces are contemplated, including but not limited to corner molding, chair rail, quarter round, and the like.

A second component of the system 10 is a network of conductive material 16 (FIGS. 4 and 5) that distributes power from the trim pieces 14 to remote locations on the wall. In applications where power is transmitted wirelessly or the entire surface is made conductive, the conductive material 16 is not needed, or may be maintained and used for carrying a different voltage than a wireless system.

Another component of the system 10 is at least one and preferably a plurality of magnetic fasteners 18 embedded in the substrate 12. Such magnetic fasteners 18 are typically a disk of metallic or otherwise magnetic material and are secured in place on the substrate 12 using threaded fasteners 19 (FIG. 1) and/or are provided with formations such as small teeth (not shown) for gripping the substrate to prevent rotation. As an option, the fasteners 18 are also provided with a covering of wallboard joint tape or paper (not shown) to facilitate their incorporation into the finished substrate surface using wallboard joint compound. Once installed in the substrate 12, the fasteners 18 support electronic appliances, generally designated 20, which receive power from the trim pieces 14, either wirelessly or through the conductive material 16. It is contemplated that the electronic appliances 20 may take the form of switches, such as a wireless dimmer 20a shown in FIG. 1, speakers, microphones, flat screen TV's, digital photo albums, thermostats, framed photos or paintings, light fixtures, IOT (Internet of Things) devices, among other such appliances as are known in the art.

Referring now to FIGS. 1, 3-5, each trim piece 14 has an outer, decorative surface 22, an opposite inner surface 24 facing the substrate 12, a first end surface 26 and an opposite second end surface 28. On or associated with the inner surface 24 is at least one conductive element 30 extending from the first end surface 26 to the second end surface 28. In the preferred embodiment, the conductive element 30 is provided in a pair of preferably spaced, parallel conductive strips 32. The strips 32 are contemplated as being made of conductive foil, conductive tape, conductive ink, conductive nonwoven graphene mesh, or other conductive material as is known in the art. As described further below in relation to FIG. 6, the conductive element 30 receives power, preferably low voltage DC power in the range of 3-48 volts, from a power cord connected to line voltage, and having a suitable transformer.

Each conductive element 30 has a connector surface 34 at each of the first and second end surfaces 26, 28. Examples of common connectors are those manufactured by Molex Corporation, as well as those specified by USB standards. Upon adjacent trim pieces or pieces 14 contacting each other (FIG. 6), the first end surface 26 of one trim piece contacts the second end surface 28 of another trim piece in end-to-end fashion, so that electrical connection is made between the trim pieces. It will be understood that the conductive elements 30 of adjacent trim pieces are in registry with each other for enhancing the electrical connection between the trim pieces 14. Using this end-to-end connection technique, an entire interior room can be connected to the present power distribution system 10.

Figure 3:
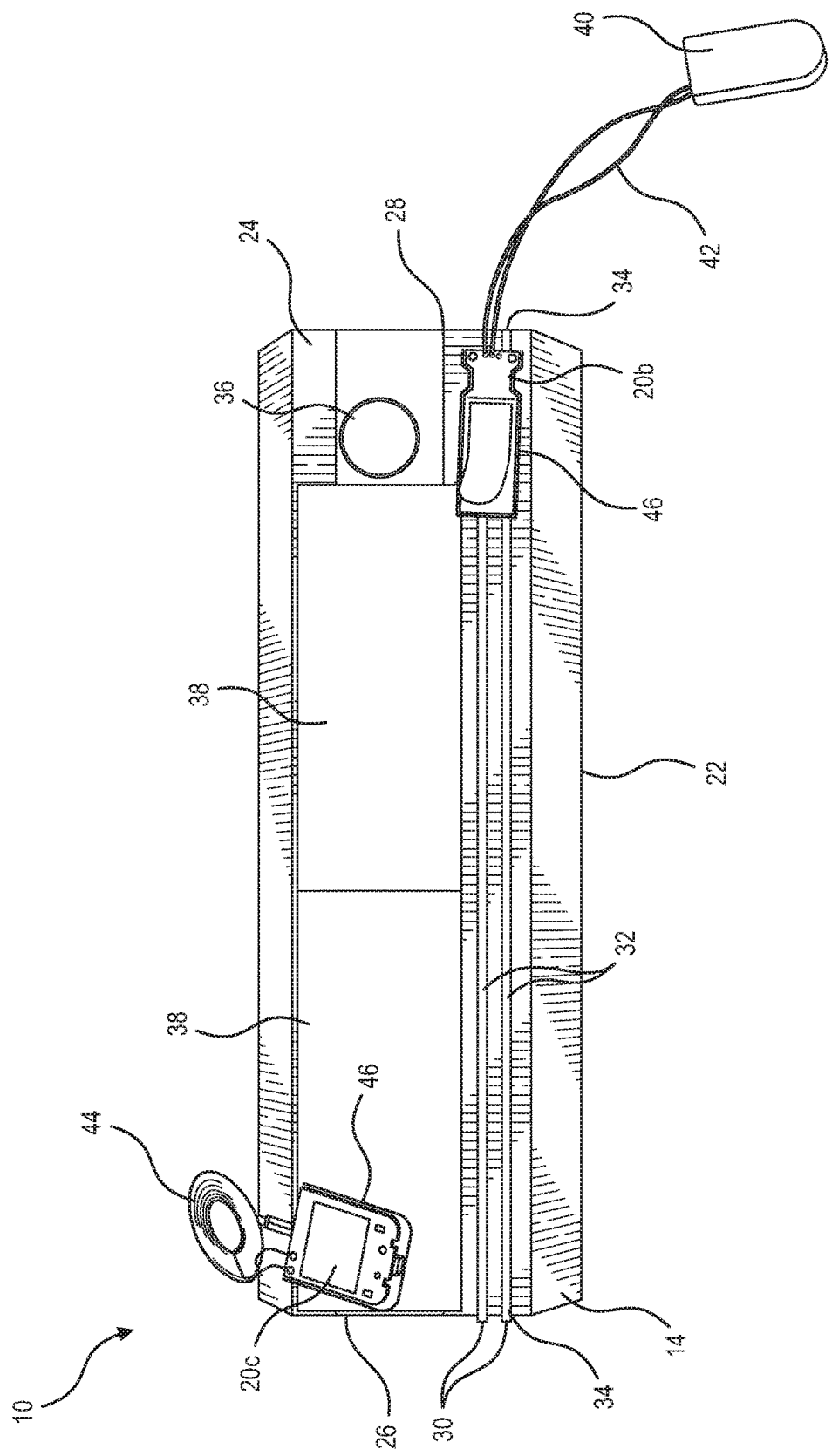
FIG. 3 is a rear view of the present decorative wall trim, showing connective circuitry components.
Figure 5:
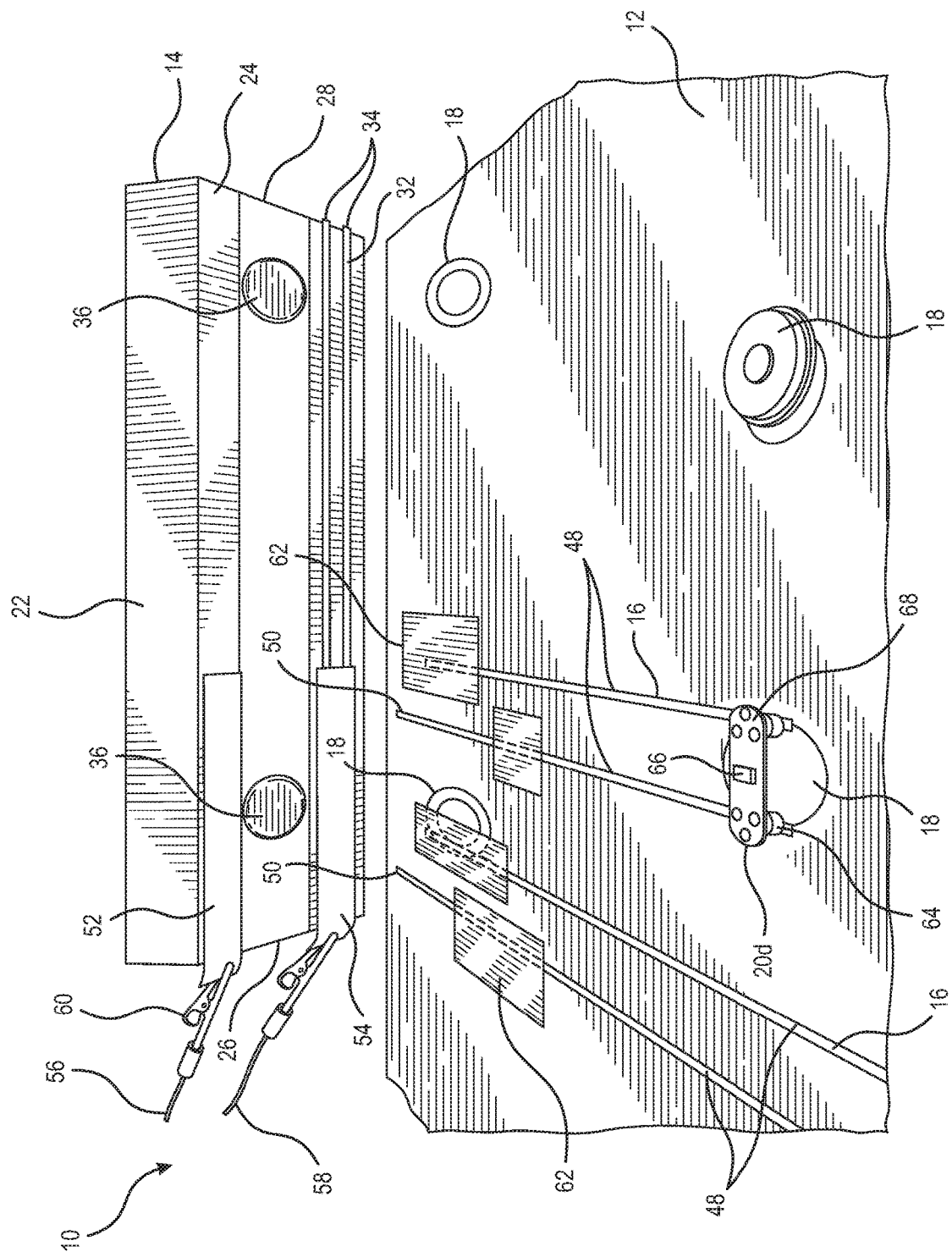
FIG. 5 is a fragmentary, partially exploded view of the system of FIG. 4.

Referring now to FIGS. 3 and 5, also included on each trim piece 14 is at least one magnetic fastener 36 secured to the inner surface 24 of each trim piece for releasably attaching the trim piece to a complementary magnetic fastener 18 secured to the substrate 12. Using this installation technique, the trim pieces 14 are easily removable from the substrate 12 for maintenance of the conductive element and/or installation of any additional appliances 20. As a further option, the trim piece 14 is provided on the inner surface 24 with an additional conductive panel 38 made of graphene mesh. In FIG. 3, two appliances 20 are shown connected to the trim piece 14. A first appliance 20b is a water sensor, which is connected to the conductive strips 32 to receive power. A remote alarm unit 40 is connected to the water sensor 20b by conventional wires 42, and emits an audible and/or visual signal when water levels reach the sensor. Another appliance 20c is a wireless power transmitter, which receives power through the graphene mesh 38 and the conductive strips 32.

Once powered, the transmitter 20c is connected to an inductive coil 44 which thus provides a source of wireless power to other appliances 20 within the range of the coil which are also equipped with inductive receivers. Both the appliances 20*b* and 20*c* are preferably located in cavities 46 in the inner surface 24 of the trip strip 14 so that they are flush with the inner surface to facilitate the trim piece being attached to the substrate 12.

Figure 4:
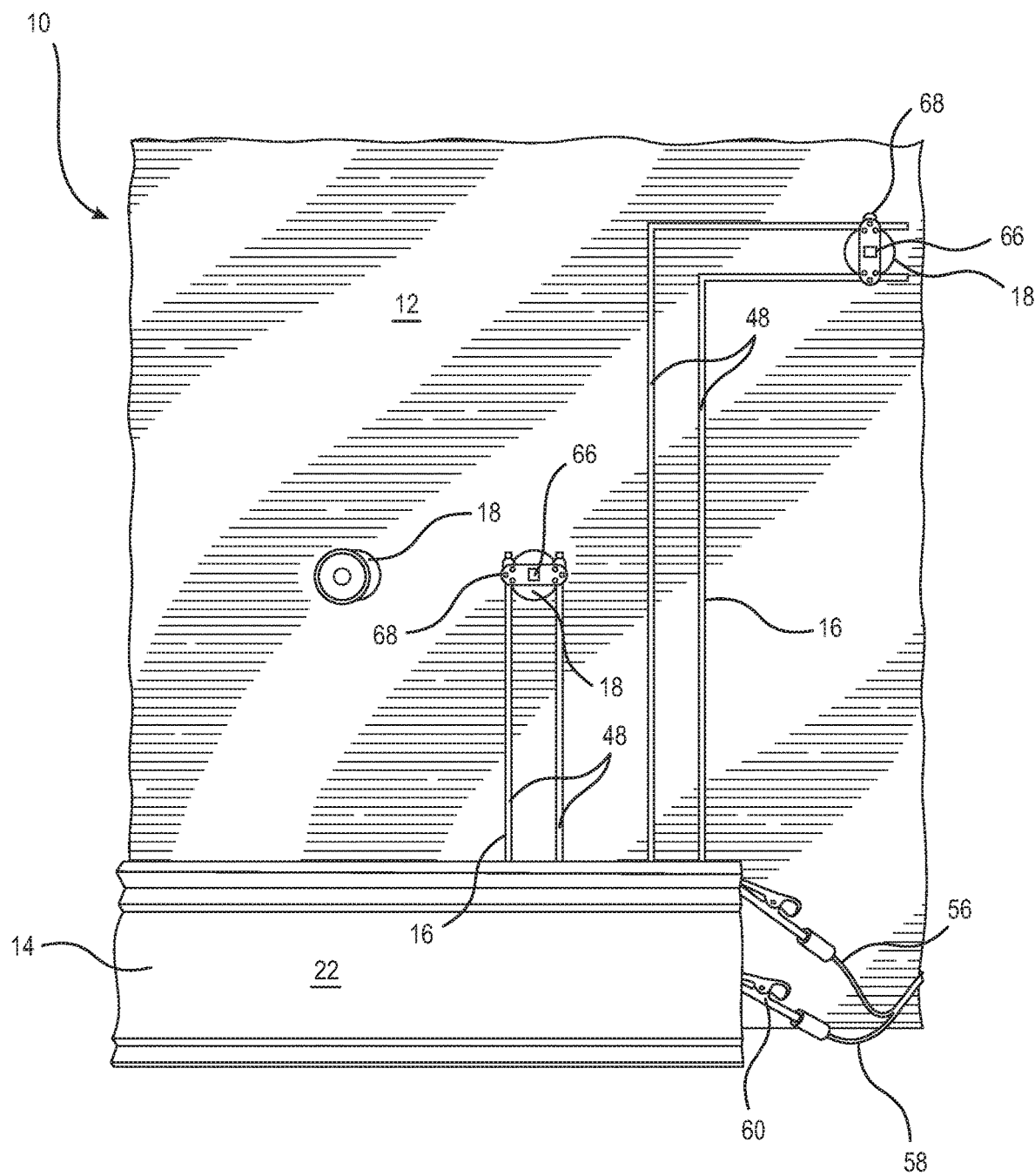
FIG. 4 is a fragmentary front view of a wall equipped with the present decorative trim and power distribution system.

Referring now to FIGS. 4 and 5, appliances 20 are attached to the substrate 12 by being magnetically fastened to magnetic fasteners 18 embedded in the substrate. Electrical connection between the trim pieces 14 and the attached appliances 20 is achieved in one embodiment by the use of substrate conductive elements 48 which are applied directly to the substrate 12. Such conductive elements 48 are taken from the group including conductive strips, conductive foil, conductive ink, conductive tape, conductive paper, or the like, all of which are easily applied to the substrate 12, and are readily obscured by conventional wallboard joint compound, paint, and/or wall covering as is customary in decoration of interior walls. Free ends 50 of the substrate conductive elements 48 are sufficiently long to connect to the conductive element 30 on the trim piece 14 once it is attached to the substrate 12.

More specifically, it is seen that the conductive elements 48 in FIG. 5 are shown with different lengths because one of them is dimensioned to engage a connective strip of graphene 52 supplying one current polarity (positive or negative), and the other is dimensioned to engage a connective strip of graphene 54, supplying the other polarity. Voltage is applied to the strips 52, 54 by corresponding power cord sources, 56, 58. In the depicted embodiment, the power cord sources 56, 58 are connected by alligator clips 60, however it is contemplated that other known electrical connection technologies are suitable, including threaded fastener terminals, soldered connections and the like as are well known in the art. To prevent shorting out caused by the conductive elements 48 touching both connective strips 52 and 54, pieces of insulating material 62 such as tape are applied where needed.

As described above, magnetic fasteners 18 are embedded in and are flush with, the substrate 12. An appliance 20*d* is an LED diode which is magnetically secured to the substrate 12 using the adjacent fastener 18. Conductive standoffs 64 contact the appropriate substrate conductive elements 48, and the diode 20*d* has an LED element 66 that is preferably centrally located on a base circuit board 68, however other locations are contemplated. Upon connection to the magnetic faster 18, the LED element 66 is illuminated. Also, FIGS. 4 and 5 depict a magnetic fastener 18 before installation in the substrate 12.

Figure 6:
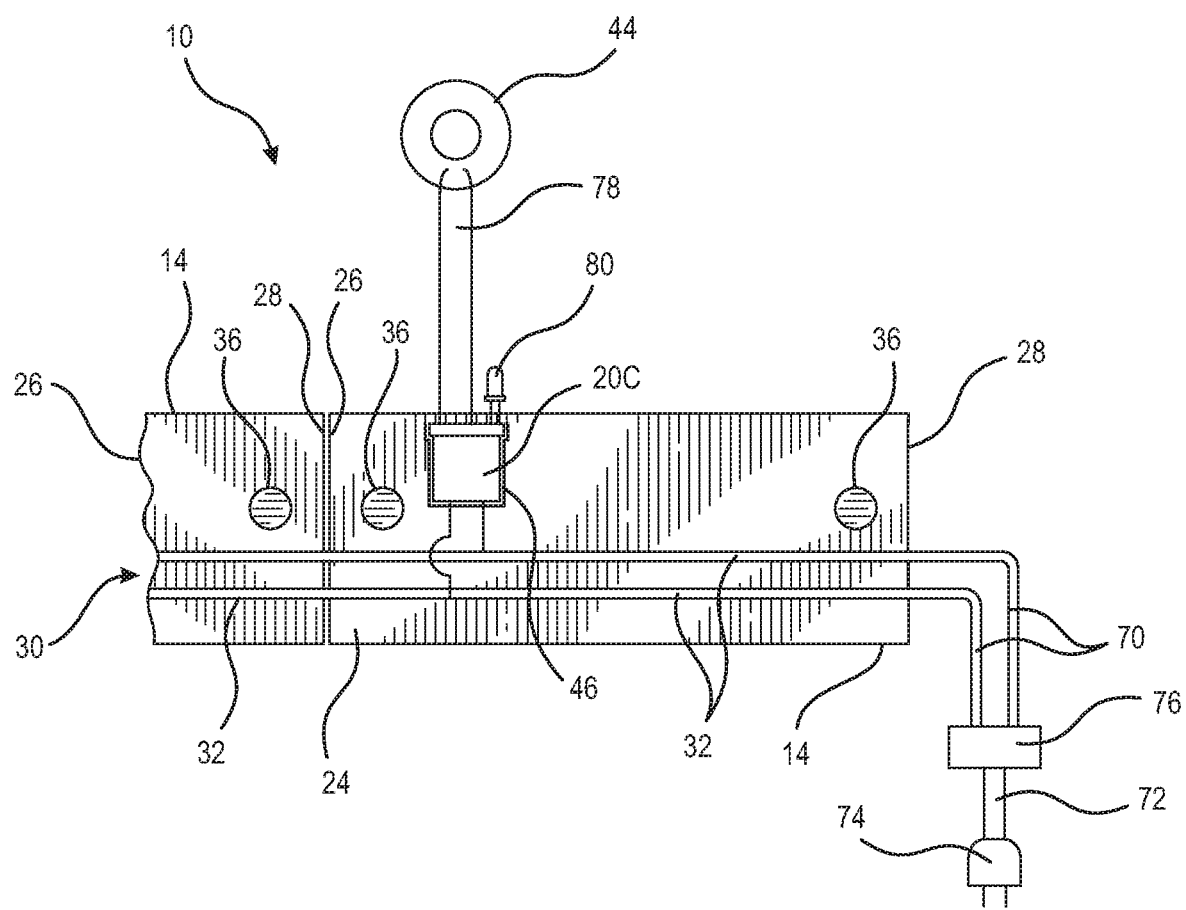
FIG. 6 is a schematic-style representation of the present circuit.

Referring now to FIG. 6, a schematic of the system 10 is depicted. The trim piece 14 is shown with a pair of magnetic fasteners 36 on the inner surface 24, which are located to be in registry with associated magnetic fasteners 18 on the substrate 12. It is also contemplated that the magnetic fastener 36 takes the form of a magnetically receptive strip attached to the inner surface 24. Thus, the trim piece 14 is releasably secured in place on the substrate 12, but is readily removable for maintenance and/or the addition of additional conductive elements 30 or appliances 20. In this embodiment, the conductive strips 32 are each secured to a lead 70 of a power cord 72 having a standard plug 74 configured for insertion into a wall socket as is well known in the art. A transformer 76 is connected to the power cord 72 to step down the line voltage to be in the desired range of 3-48 volts, DC. It is contemplated that the voltage range may vary to suit the application, and that line voltage lower than 3 volts is possible.

The appliance 20*c* is the wireless transmitter, connected by wires 78 to the inductive coil 44. Once connected to the power cord 72 by the conductive strips 32, wireless devices such as appliances 20*a*, 20*b*, 20*c*, 20*d* or other such devices that are attachable to the substrate 12 by the magnetic fasteners 18 and are within the range of the coil 44 will be powered. An optional LED 80 is connected to the transmitter 20*c* to indicate by illumination when the transmitter is powered. In situations where the inductive coils 44 are used as described above, the appliances 20 are powered without the use of the substrate conductive elements 48.

While a particular embodiment of the present magnetic decorative trim with DC power transmission has been described herein, it will be appreciated by those skilled in the art that changes and modifications may be made thereto without departing from the invention in its broader aspects and as set forth in the following claims.

The invention claimed is:

1. A decorative interior trim piece for use in a low voltage power transmission system, the decorative interior trim piece comprising:
    an outer, decorative surface, an opposite inner surface facing a substrate, a first end surface and an opposite second end surface;
    at least one conductive element being on said inner surface and including a first end and a second end, said first end extending to and forming part of said first end surface and said second end extending to and forming part of said second end surface;
    each said at least one conductive element having a connector surface at each said first end and said second end of said at least one conductive element; and
    at least one magnetic fastener secured to said inner surface for releasably attaching said trim piece to the substrate.

2. The decorative interior trim piece of claim 1, wherein the decorative interior trim piece is one of a base board, crown molding and chair rail.

3. The decorative interior trim piece of claim 1, wherein said low voltage system is configured for operating in the range of 3-48 volts.

4. The decorative interior trim piece of claim 3, wherein said low voltage system operates as direct current (DC).

5. The decorative interior trim piece of claim 1, further including at least one recessed compartment on said inner surface dimensioned for accommodating an internet device.

6. The decorative interior trim piece of claim 5, wherein said internet device is one of a DC transformer and a wireless transmitter.

7. The decorative interior trim piece of claim 1, further including at least one conductive element on the substrate constructed and arranged for connection to at least one said conductive element on said trim piece and connected to a corresponding powered device.

8. The decorative interior trim piece of claim 7, wherein said at least one conductive element on the substrate is conductive tape, conductive strips, or conductive ink.

9. A low power distribution system for use on interior walls defining at least one vertical substrate, the system comprising:
    a plurality of trim pieces associated with the substrate, each said trim piece having an outer, decorative surface, an opposite inner surface facing the substrate, a first end surface and an opposite second end surface;
    at least one conductive element being on said inner surface of each said trim piece and including a first end and a second end, said first end extending to and forming part of said first end surface and said second end extending to and forming part of said second end surface;

each said at least one conductive element having a connector surface at each said first end and said second end, so that upon adjacent trim pieces contacting each other, said first end surface of one said trim piece contacts said second end surface of another said trim piece, said conductive elements being in registry with each other to make electrical connection with each other; and at least one magnetic fastener secured to said inner surface of each said trim piece for releasably attaching said trim piece to a complementary magnetic fastener secured to the substrate.

10. The low power distribution system of claim 9, further including at least one conductive element on the substrate that is constructed and arranged for connection to at least one said conductive element on each said trim piece and also connected to a corresponding powered device, said at least one substrate conductive element is conductive tape, conductive strips, or conductive ink.

* * * * *